United States Patent
Ogawa et al.

(10) Patent No.: US 6,291,880 B1
(45) Date of Patent: Sep. 18, 2001

(54) SEMICONDUCTOR DEVICE INCLUDING AN INTEGRALLY MOLDED LEAD FRAME

(75) Inventors: Toshio Ogawa, Hitachinaka; Masaaki Takahashi; Masahiro Gouda, both of Hitachi; Noritaka Kamimura, Hitachinaka; Kazuhiro Suzuki, Mito; Junichi Saeki, Yokohama; Kazuji Yamada, Hitachi; Makoto Ishii, Utsunomiya; Akihiro Tamba, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/248,000

(22) Filed: Feb. 10, 1999

(30) Foreign Application Priority Data

Feb. 12, 1998 (JP) .................................................. 10-029491

(51) Int. Cl.⁷ .................................................. H01L 23/34
(52) U.S. Cl. ........................ 257/723; 257/724; 257/725
(58) Field of Search ..................................... 257/723–725

(56) References Cited

U.S. PATENT DOCUMENTS

| | | | |
|---|---|---|---|
| 5,077,595 | 12/1991 | Fukunaga | 257/659 |
| 5,699,609 | 12/1997 | Wieloch | 29/830 |
| 5,751,063 * | 5/1998 | Baba | 257/723 |
| 5,920,119 * | 7/1999 | Tamba et al. | 257/718 |
| 5,942,797 * | 8/1999 | Terasawa | 257/723 |
| 6,018,463 * | 1/2000 | Winslow et al. | 361/803 |

FOREIGN PATENT DOCUMENTS

| | | |
|---|---|---|
| 0774782A2 | 5/1997 | (EP) . |
| 3-63822 | 10/1991 | (JP) . |
| 6-80748 | 10/1994 | (JP) . |
| 7-263621 * | 7/1995 | (JP) . |
| 8-298299 | 11/1996 | (JP) . |
| 9-186269 | 7/1997 | (JP) . |
| 1022435 | 1/1998 | (JP) . |
| 1093015 | 4/1998 | (JP) . |
| 10125826 | 5/1998 | (JP) . |
| 10135380 | 5/1998 | (JP) . |

OTHER PUBLICATIONS

Okawa et al., "Amodel of Three Phase Inverter Hybrid IC with 60V/150A MOSFET", 1995 IEEE, Aug. 10, 1995, pp. 898–903.

* cited by examiner

Primary Examiner—Carl Whitehead, Jr.
Assistant Examiner—Jamie L. Brophy
(74) Attorney, Agent, or Firm—Antonelli, Terry, Stout & Kraus, LLP

(57) ABSTRACT

A semiconductor device includes a main circuit part having a semiconductor device formed on an electrode plate of a lead frame and a control circuit part having protective functions, which is integrally molded by a resin mold part into an integral mold structure.

11 Claims, 6 Drawing Sheets

SEMICONDUCTOR DEVICE INCLUDING AN INTEGRALLY MOLDED LEAD FRAME

BACKGROUND OF THE INVENTION

This invention relates to a semiconductor device having a construction in which circuit components inclusive of a switching semiconductor device are molded by a resin mold.

Power semiconductor devices of this kind are heretofore described in JP-B-3-63822 and JP-B-6-80748. A switching semiconductor device is set on a lead frame with spaces of a predetermined gap and this lead frame is in turn set to a heat sink made of a metal. A resin is packed for integral molding to the entire exterior portion inclusive of the spaces so as to constitute a semiconductor device. Because a resin layer is interposed between a conductor layer to which the semiconductor device is fixed and the heat sink in this construction, a plurality of semiconductor devices can be mounted, and because the number of components is small, reliability is high. Nonetheless, this construction is not free from the following items.

As described above, the method packs the resin to the spaces in which the devices are set in advance. Therefore, voids are likely to be entrapped at the time of molding and the thickness of the resin layer is likely to fluctuate. Generally, the heat transfer rate of the resin layer of this kind is extremely low and even a slight error of the layer thickness results in great variance of a thermal resistance. In consequence, stable quality cannot be obtained easily in mass-production plants. It is difficult for the same reason to lower the thermal resistance by markedly reducing the thickness of the insulating layer (to not greater than 0.1 mm, for example).

Another item resides in that because conductor wiring is constituted by the lead frame, miniaturization is difficult to attain. For instance, it is very difficult to form wiring having complicated and very fine shapes for mounting a microcomputer which is to control a driver IC, for example.

SUMMARY OF THE INVENTION

It is an object of the present invention to provide a small-size power semiconductor device which can solve the difficulties of the methods described above and has a low thermal resistance but has high functional performance. In other words, the present invention provides a compact power semiconductor device capable of forming an insulating layer having a thin, uniform and stable film thickness and eventually, having a low thermal resistance, by applying a pre-molded sheet-like resin insulating layer made of a resin material different from a material of an exterior resin mold between a lead frame and a heat sink, that is, a base substrate.

It is another object of the present invention to provide with high reliability and at a low cost construction which can add high functional performance such as a driver IC for driving a switching semiconductor device, a microcomputer for controlling the driver IC and various protective circuits and communication circuits by incorporating a printed substrate capable of extending very small wiring.

To accomplish these objects, the present invention employs the following means.

In a semiconductor device including a main circuit part, a control circuit part, an exterior resin part, and a main terminal and a control terminal extended to the surface of the exterior resin part, the main circuit part has a construction in which a semiconductor device is fixed on an electrode plate and the electrode plate has a structure having a base substrate so disposed as to clamp a resin layer as an electric insulating layer; the control circuit part includes at least one circuit device on a substrate and the circuit device and the substrate are connected electrically and directly with each other; the main circuit part and the control circuit part are electrically connected; and at least a part of the base substrate is exposed substantially to the outer surface of the exterior resin part while other portions are integrally molded by the exterior resin part.

In a method of fabricating a semiconductor device including a main circuit part, a control circuit part, and a main terminal and a control terminal extended to a surface of an exterior resin part, the present invention provides a method of fabricating a semiconductor device which includes a step of fixing a semiconductor device as the main circuit part to a lead frame, a step of mounting at least one circuit device on a substrate as the control circuit part, a step of electrically connecting the semiconductor device and the substrate by electrically conductive wires, a step of connecting electrically the main circuit part and the control circuit part, an inspection step for selecting the control circuit part, a step of forming a resin layer on one of the surfaces of a base substrate, a step of mounting the lead frame on the resin layer and a step of molding them integrally by a resin.

DESCRIPTION OF THE PREFERRED EMBODIMENTS

The present invention will be explained hereinafter in further detail with reference to some preferred embodiments thereof, but the invention is not particularly limited to these embodiments.

Figure 1:
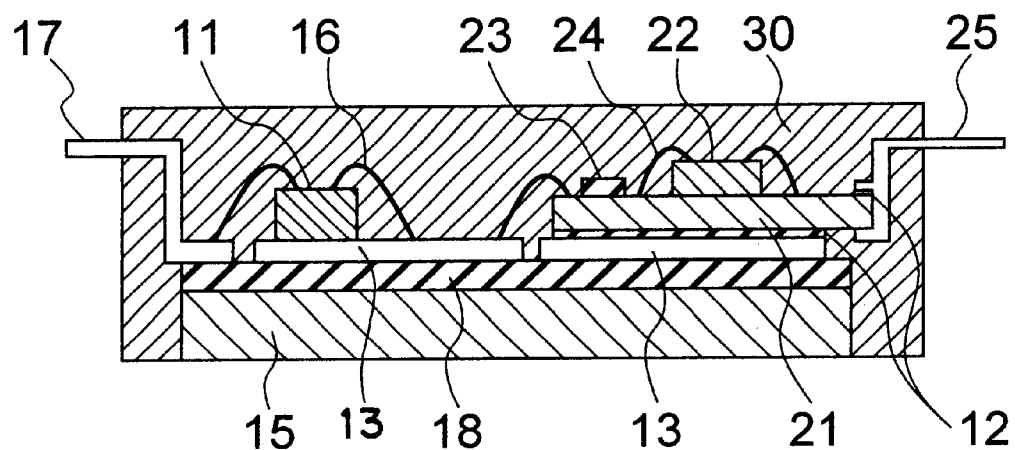
FIG. 1 is a sectional structural view of a power semiconductor device according to Embodiment 1 of the present invention.
Figure 2:
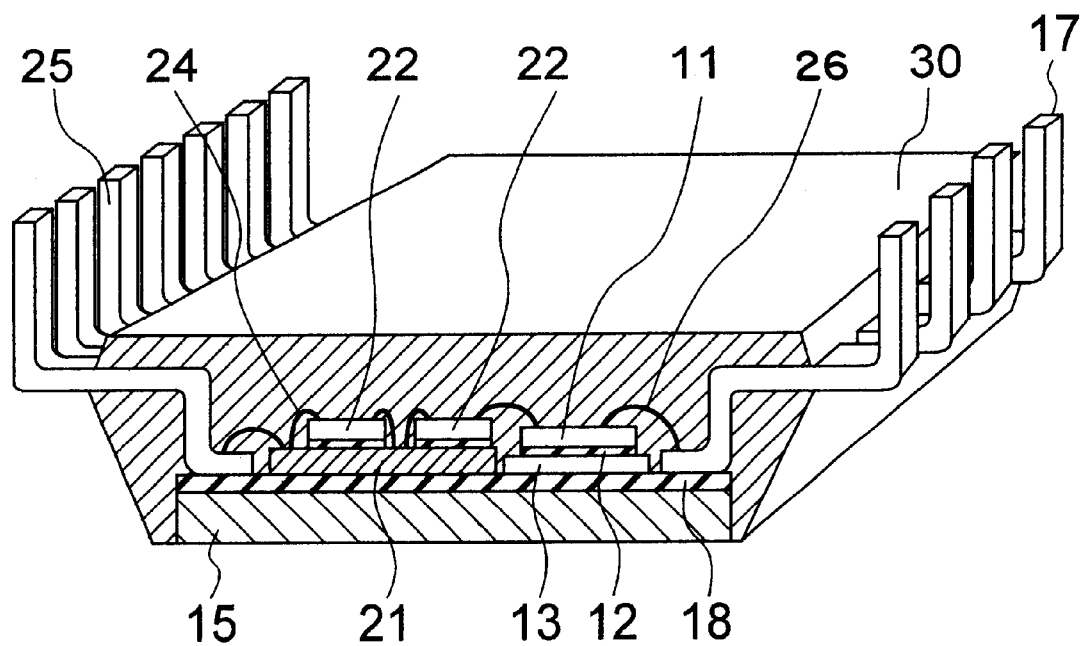
FIG. 2 is a schematic perspective view of the power semiconductor device according to Embodiment 1 of the present invention.

Embodiment 1:

FIG. 1 shows a sectional structural view of Embodiment 1 of the present invention and FIG. 2 shows its schematic perspective view. In FIG. 2, a switching semiconductor device 11 such as an IGBT (Insulated Gate Bipolar Transistor) is fixed to an electrode plate 13 of a lead frame through a solder layer 12. The other surface of the electrode plate 13 of the lead frame positioned immediately below the semiconductor device is bonded to a base substrate 15 through a resin insulating layer 18. The semiconductor device 11 is electrically bonded to the electrode plate 13 of the lead frame or to a lead terminal 17 by a wire bonding portion 26 of aluminum, and the lead terminal 17 as a part of the lead frame is extended as a main terminal to the surface of a resin mold part 30 so as to constitute a main circuit part. On the other hand, a control-integrated circuit device 22 and package components 23 such as passive components are mounted on a printed substrate 21 and the control-integrated circuit device 22 is electrically connected to the printed substrate 21 by a wire bonding portion 24 of Au thin wires, etc. The control terminal 25 extended out from the resin mold part 30 is connected to a part of the printed substrate 21 to constitute a control circuit part. The control circuit part and the main circuit part are electrically bonded by a wire bonding portion 16 and the overall system is integrally molded by an exterior resin mold part 30.

The power semiconductor device having this construction is fabricated by the following process steps. First, a conductor pattern having a desired shape is formed on both surfaces of the printed substrate 21. In this embodiment, substantially the whole surface of the back of the printed substrate 21 is used as a conductor layer for the connection with a ground layer. One bare chip driver IC having a size of 3 mm×4 mm is bonded and cured by an epoxy resin as a control-integrated circuit device 22 on the surface on the opposite side. Next, the control-integrated circuit device 22 and the printed substrate 21 are connected mutually by Au wires having a wire diameter of 20 µm, and the control-integrated circuit 22 and the wire bonding portion 24 are locally covered with a potting resin, whenever necessary, in association with subsequent process steps. Package components 23 such as chip capacitors, resistors, etc, are connected by soldering to constitute a control circuit part. Electrical characteristics are inspected under this state and approved products are selected. Next, a lead frame for forming a control terminal 25 is bonded by soldering to the printed substrate. On the other hand, an uncured resin sheet for forming a resin insulating layer 18 is provisionally press-bonded to one of the surfaces of the base substrate 15 at 120° C. The lead frame 13 is placed on the upper surface of this resin sheet, is pressed at 150° C. and is thereafter cured at 180° C. for 15 minutes. Next, an IGBT chip having a size of 7 mm×7 mm as a switching semiconductor device 11 is bonded by soldering to a predetermined position of the lead frame 13. This device 11 is electrically connected to the lead frame 13 by the wire bonding portion 16. The conductor on the back of the printed substrate 21, which is selected in advance as described above and to which the control terminal 25 is fitted, and the ground layer of the lead frame 13 are simultaneously bonded and integrated by soldering at the time of this solder bonding.

A series of circuits prepared by a series of steps described above are set into a mold part and a resin mold part 30 is shaped by packing a resin into the mold at a predetermined temperature and a predetermined pressure. This embodiment uses the blend material tabulated in Table 1 as the material for the resin mold part 30. The blend proportion in Table 1 represents a weight ratio.

TABLE 1

|  | blend ratio |
| --- | --- |
| o-cresol novolak type epoxy resin | 90 |
| brominated phenol novolak type epoxy resin | 10 |
| phenol novolak resin | 52 |
| triphenylsulfin | 1 |
| antimony trioxide | 4 |
| epoxy silane | 2 |
| Hoechist wax | 1 |
| carbon black | 1 |
| epoxy-modified polydimethylsiloxane | 10 |
| silicon oxide (spherical powder) | 643 |

Because this material contains a large amount of silicon oxide as the filler, it has a high Young's modulus of 1,800 kgf/mm$^2$ and has sufficient rigidity to protect the inside. Because its coefficient of linear expansion is as lows about 12 to about 15 ppm/°C., warp of the base substrate 15 after molding and curing is small such as about 40 µm and this value does not render any practical problem.

After-curing is effected, whenever necessary, after molding of the mold resin so as to promote curing of the mold resin. Next, the portion of the lead frame 13 extended out from the resin mold part 30 is cut or shaped and a semiconductor device having a main terminal (17) and a control terminal 25 having a desired shape can be obtained.

Though this embodiment deals with the IGBT device as an example of the switching semiconductor device 11, the device may be other exothermic devices such as an MOS transistor.

Though this embodiment uses silicon oxide shown in Table 1 as filler contained in the resin mold part 30, the filler may be other materials such as beryllia, zirconia, silicon nitride, aluminum nitride, silicon carbide, and so forth.

The feature of this embodiment having the resin insulating layer 18 using the uncured resin material which is shaped into the sheet form as the starting material can be applied to those devices which have a low thermal resistance and a relatively large current capacity.

Figure 3:
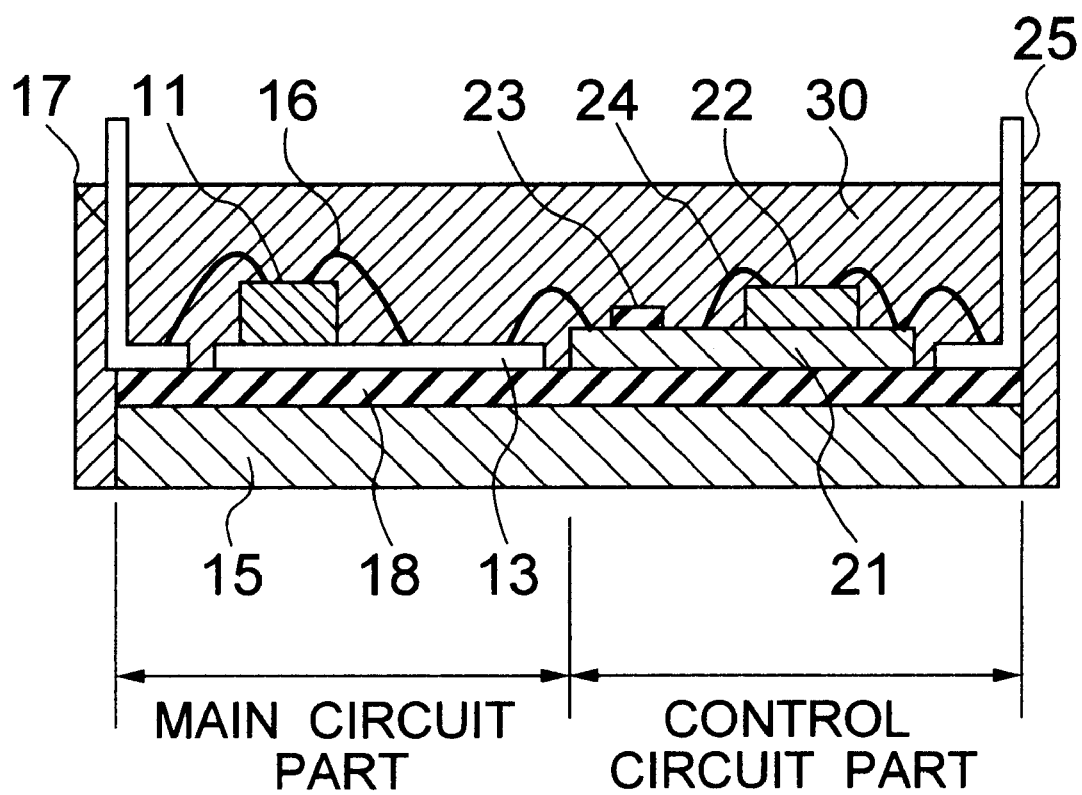
FIG. 3 is a sectional structural view of a power semiconductor device according to Embodiment 2 of the present invention.

Embodiment 2:

FIG. 3 shows another embodiment of the present invention having substantially the same construction as that of Embodiment 1. The difference of this embodiment from Embodiment 1 is as follows. A part of the lead frame is used for the control terminal 25 and the wire bonding portion 16 connects electrically the control terminal 25 and the printed substrate 21. This embodiment has the construction in which the main terminal (17) and the control terminal 25 are extended from the upper surface of the resin mold part 30.

Figure 4:
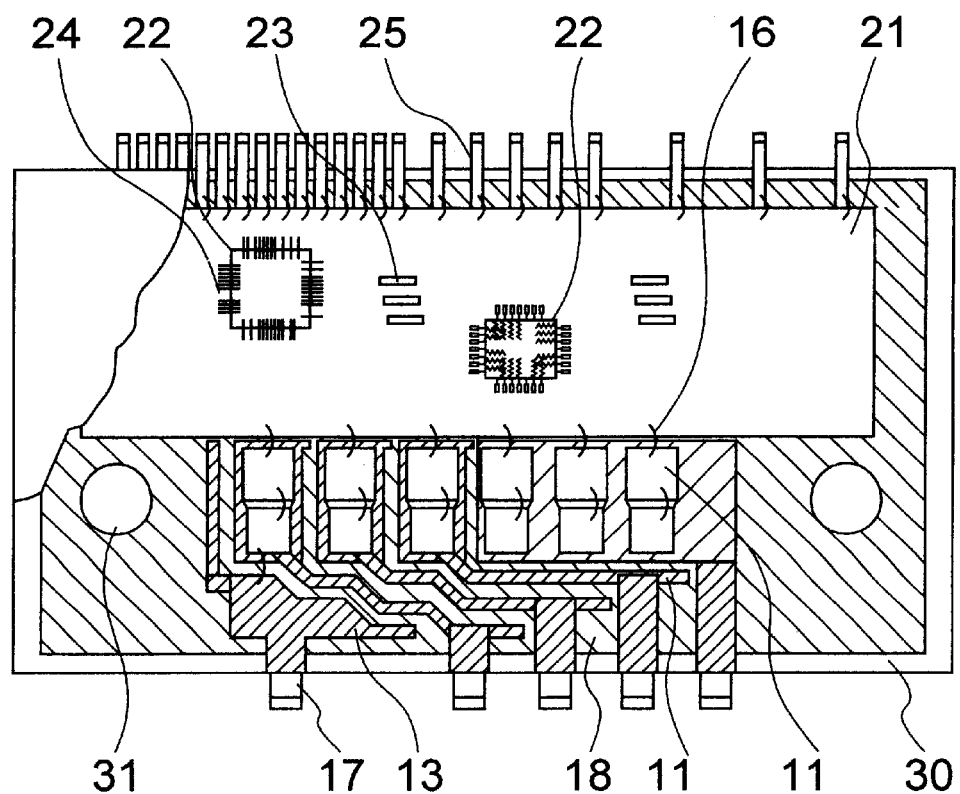
FIG. 4 is a structural top view of the power semiconductor device according to Embodiment 2 of the present invention.

FIG. 4 shows a planar structural view of this embodiment. A microcomputer 22 is disposed at the control circuit part and fitting holes 31 for fixing the main body of the resin mold part 30 are formed. The construction of this embodiment forms collectively the control terminals 25 by using the integral lead frame 13. Therefore, the process step of soldering the control terminals 25 becomes unnecessary. Because the main terminal (17) and the control terminals 25 are extended to the upper surface of the resin mold part, a distance of the insulation space with the ground layer and an insulation creep distance can be secured sufficiently.

Figure 5:
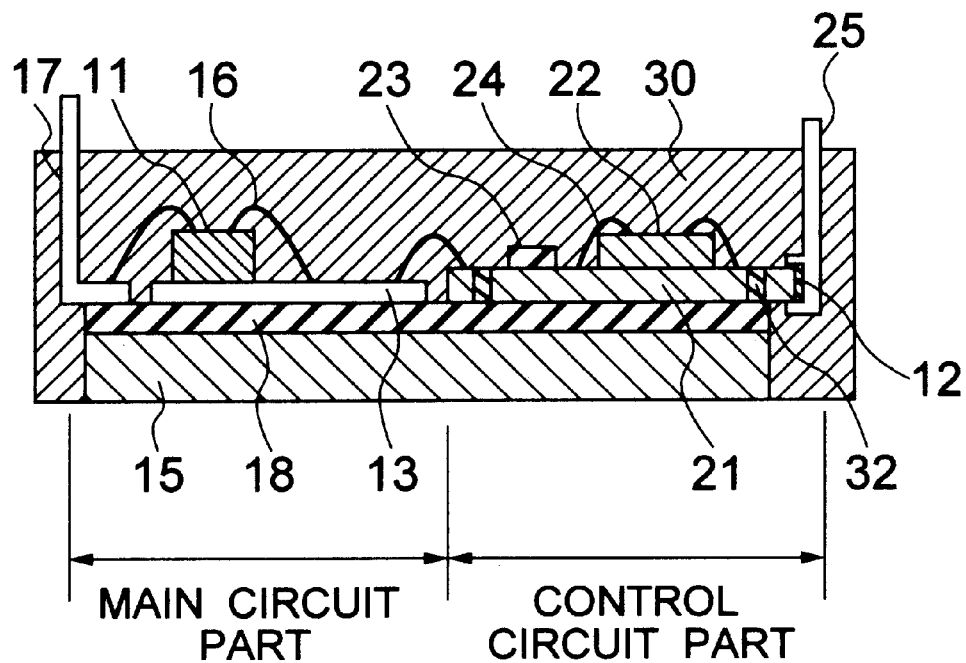
FIG. 5 is a sectional structural view of a power semiconductor device according to Embodiment 3 of the present invention.

Embodiment 3:

FIG. 5 shows another embodiment of the present invention which has substantially the same construction as that of Embodiment 2. The difference of this embodiment from the Embodiment 2 is as follows. Desired conductor patterns are formed on both surfaces of the printed substrate 21 and both surfaces are electrically connected with one another by means such as through-holes. The back of the printed substrate 21 is firmly bonded by an insulating resin adhesive.

The construction of this embodiment using the printed substrate 21 having the desired conductor patterns which are formed on both surfaces the substrate 21 can form a more complicated and miniature circuit, and the bare chip driver IC 22, and/or the control-integrated circuit device such as the microcomputer 22 and various other protective circuits can be mounted. Therefore, this embodiment provides the feature in that higher functional performance can be attained more easily.

Figure 6:
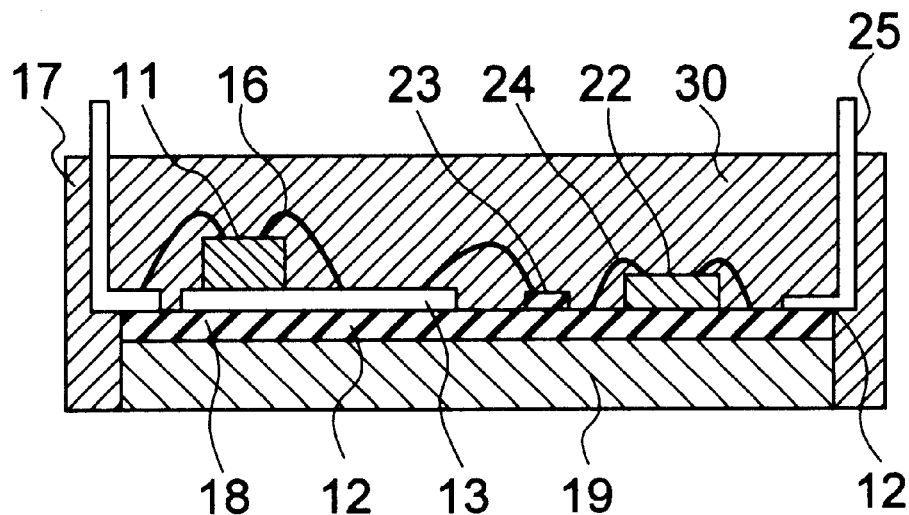
FIG. 6 is a sectional structural view of a power semiconductor device according to Embodiment 4 of the present invention.

Embodiment 4:

FIG. 6 shows a sectional construction of still another embodiment of the present invention. The main difference of this embodiment from Embodiments 1 through 3 is as follows. A resin-insulated metal substrate 19 is used for the base substrate 15 and the control circuit part is directly formed on this metal substrate 19. The construction of this embodiment is achieved by the following process steps. First, a resin insulating layer is formed on one of the surfaces of the metal substrate such as an Al substrate and a desired conductor pattern is formed on the surface of the resin insulating layer to obtain a resin-insulated metal substrate 19 as a constituent component. The control-integrated circuit device 22, the package components 23, etc, are mounted to the surface of this substrate 19 by the same process step as that of Embodiment 1. The lead frame, the main terminal 17 and the control terminals 25 are bonded onto the metal substrate 19 simultaneously with these package components 23 or by a separate process step. Selection of the control circuit part is carried out under this state.

Next, the switching semiconductor device 11, the control-integrated circuit device 22 and the lead frame 13 are electrically connected by the Al wire bonding portion 16. A series of circuits prepared by these steps are integrally molded into the resin mold part to obtain a desired semiconductor device.

The feature of this embodiment using the insulated metal substrate 19 resides in the conjoint use of the lead frame having a large allowable current. In other words, miniature conductor wiring can be formed on the insulated metal substrate and the control-integrated circuit device can be mounted easily. On the other hand, a large current is allowed to flow through the main circuit due to the thick lead frame 13 and at the same time, the heat generated from the switching semiconductor device 11 can be dissipated in the horizontal direction. Therefore, a lower heat resistance can be achieved for the overall system.

Figure 7:
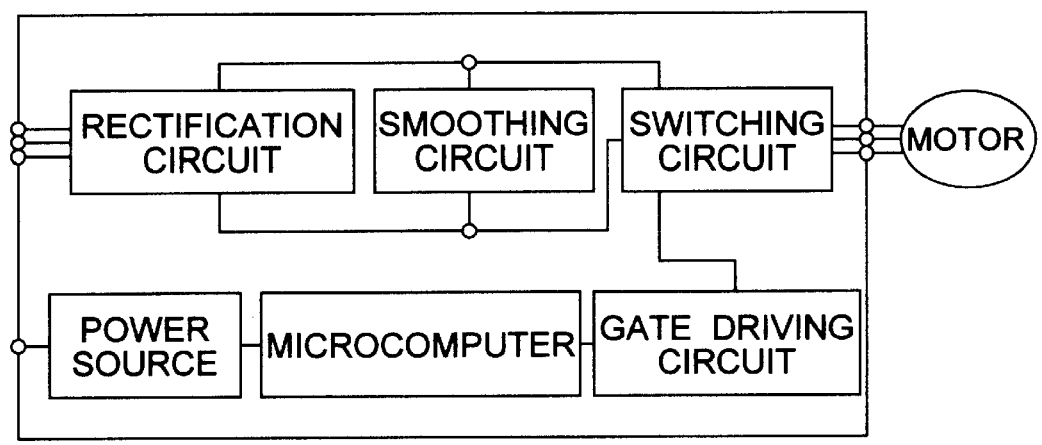
FIG. 7 is a block circuit diagram of an air inverter module according to one embodiment of the present invention.

Embodiment 5:

FIG. 7 shows a system produced by directly fitting an inverter using the power semiconductor device fabricated in the same way as in Embodiment 1 to a three-phase induction motor and integrating them together. The construction of the electric circuit is the same as the construction shown in the block diagram of FIG. 7. The semiconductor device according to this embodiment has a low thermal resistance and has high reliability because it has the control circuit part disposed in the proximity of the switching semiconductor device 11. Therefore, this inverter can be integrally combined with those motors which are used under a severe condition, such as a compressor for a room air conditioner and various motors such as conveyor motors. When the inverter and the motor are integrated, the reduction of the overall size and high reliability of the respective apparatuses can be accomplished.

Figure 8:
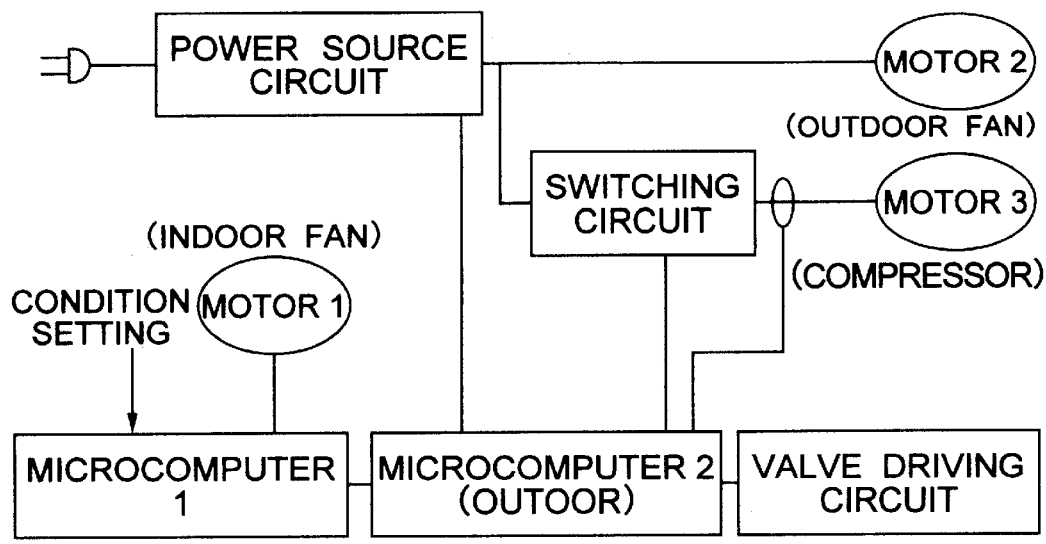
FIG. 8 is a block circuit diagram of an air conditioner according to one embodiment of the present invention.
Figure 9:
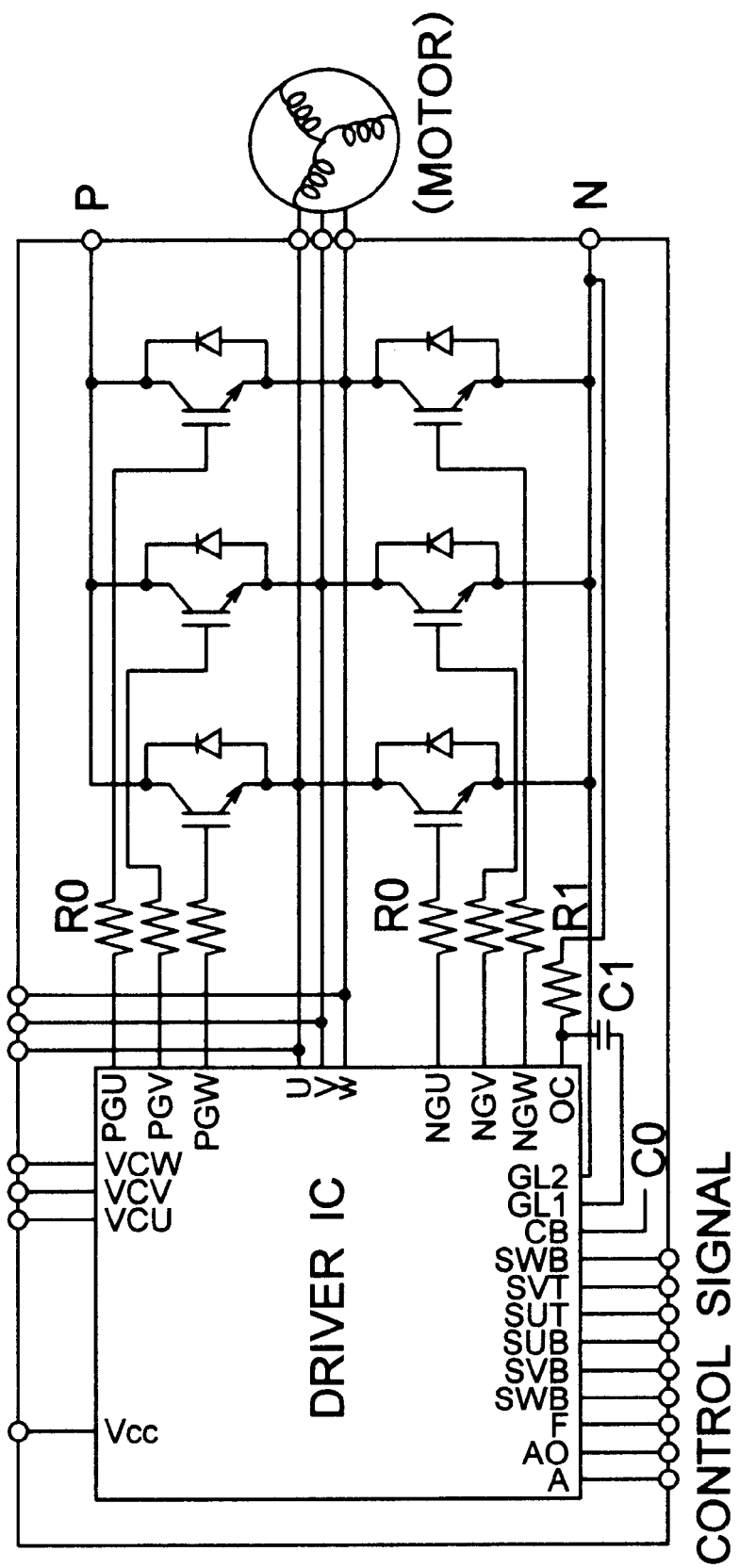
FIG. 9 is a block circuit diagram of an air conditioner switching unit according to one embodiment of the present invention.

Embodiment 6:

FIG. 8 shows a block circuit diagram of a home air conditioner to which the semiconductor device according to Embodiment 1 is applied. The air conditioner shown in the drawing uses the semiconductor device of Embodiment 1 for a motor for driving a compressor. FIG. 9 shows in detail a switching circuit portion and a motor portion. In the drawing, P and N terminals are connected to a power source circuit part. The air conditioner having this construction can shape the switching circuit part in a small size and to a low thermal resistance. Therefore, the motor can be driven with high heat efficiency, and an energy saving type air conditioner can be acquired.

Energy saving type electric appliances can be likewise achieved by applying the construction of this embodiment to various other electric appliances for home or industrial use, equipped with motors, such as refrigerators, pumps, conveyors, and so forth.

As explained above, the semiconductor device according to the present invention provides the effects listed below.

1. The main circuit part is constituted by fixing the switching semiconductor device on the lead frame and disposing the base substrate through the resin insulating layer. On the other hand, the control circuit part is constituted by disposing the control circuit on the printed substrate which can form miniature wiring and can mount various protective circuits for preventing an excessive temperature, an excess current, a voltage drop, etc, and the microcomputer at the control circuit part. Both circuit parts are disposed adjacent to each other and are electrically connected with each other, and the system is reinforced as a whole by the resin mold part. Therefore, this construction can simultaneously accomplish a low thermal resistance and high reliability.

2. The driver IC and the microcomputer as the control-integrated circuit devices are disposed in the proximity of the switching device. Therefore, the response speed of the control operation is high, and high reliability can be secured more easily.

3. The yield of the products can be improved by employing the selected control circuit part, and reliability of the entire system can be improved.

4. The uncured resin sheet which is molded in advance is applied when the resin insulating layer is formed. Therefore, the resin insulating layer which has a smaller and uniform thickness can be provided.

5. The main terminal and the control terminal are extended on the upper surface of the resin mold part. Therefore, the distance of the insulating space with the ground layer and the insulating creep distance can be secured more easily.

6. Because the motor is driven by the semiconductor device having a lower thermal resistance according to the present invention, energy saving type electric appliances can be accomplished at a lower production cost.

What is claimed is:

1. A semiconductor device comprising a main circuit part, a control circuit part, an exterior resin part, and a main terminal and a control terminal both extending out of a surface of said exterior resin part, wherein said main circuit part includes a structure disposed on a base substrate, having a switching semiconductor device fixed on a lead frame electrode plate, wherein a resin layer as an electrical insulation layer is sandwiched between said lead frame electrode plate and said base substrate, wherein said control circuit part includes at least one control circuit device on a circuit patterned forming substrate, wherein said circuit patterned forming substrate is electrically connected with said control circuit device and said main circuit part is electrically connected with said control circuit part, wherein at least a part of said base substrate is exposed together with an outer surface of said exterior resin part, and said exterior resin part seals integrally said main circuit part, said control circuit part, said base substrate, said main terminal and said control terminal, and wherein said lead frame electrode plate on which said switching semiconductor device is mounted is integrated with said main terminal.

2. The semiconductor device according to claim 1, wherein said control circuit device includes at least one driver IC for driving said switching semiconductor device and a microcomputer for controlling said driver IC.

3. The semiconductor device according to claim 1, wherein said switching semiconductor device in said main circuit part includes an IGBT (Insulated Gate Bipolar Transistor).

4. The semiconductor device according to claim 1, wherein said switching semiconductor device in said main circuit part includes a MOS transistor.

5. The semiconductor device according to claim 1, wherein said control circuit part includes a bare chip IC.

6. The semiconductor device according to claim 1, wherein said exterior resin part includes a filler.

7. The semiconductor device according to claim 6, wherein said exterior resin part includes a silicon oxide filler.

8. The semiconductor device according to claim 6, wherein the plane structure of said semiconductor device is integrally molded by said exterior resin part with a substantially quadrilateral contour, one opposite side of which is arranged with said control terminal, and the other opposite side of which is arranged with said main terminal.

9. The semiconductor device according to claim 8, wherein a penetrated aperture is present on said substantially quadrilateral contour mold.

10. The semiconductor device according to claim 1, wherein said resin layer is comprised of a material different from the exterior resin part.

11. The semiconductor device according to claim 10, wherein said resin layer is comprised of a pre-molded sheet-like resin insulating layer having a predetermined low thermal resistance.

* * * * *